US012534799B2

(12) United States Patent
Grimes et al.

(10) Patent No.: US 12,534,799 B2
(45) Date of Patent: Jan. 27, 2026

(54) MULTILAYER HYDROPHOBIC FILM

(71) Applicant: SPTS Technologies Ltd., Newport (GB)

(72) Inventors: Michael Grimes, San Jose, CA (US); Yuyuan Lin, San Jose, CA (US)

(73) Assignee: SPTS Technologies Ltd., Newport (GB)

( * ) Notice: Subject to any disclaimer, the term of this patent is extended or adjusted under 35 U.S.C. 154(b) by 111 days.

(21) Appl. No.: 18/105,828

(22) Filed: Feb. 4, 2023

(65) Prior Publication Data

US 2024/0263303 A1 Aug. 8, 2024

(51) Int. Cl.
*C23C 16/40* (2006.01)
*C23C 16/455* (2006.01)
*H01L 21/02* (2006.01)

(52) U.S. Cl.
CPC ...... *C23C 16/403* (2013.01); *C23C 16/45527* (2013.01); *H01L 21/02178* (2013.01)

(58) Field of Classification Search
CPC ........................................................ B05D 1/32
See application file for complete search history.

(56) References Cited

U.S. PATENT DOCUMENTS

| | | | |
|---|---|---|---|
| 4,751,170 A | 6/1988 | Mimura et al. | |
| 5,501,877 A * | 3/1996 | Adair | C23C 16/04 427/259 |
| 6,114,099 A | 9/2000 | Liu et al. | |
| 8,293,658 B2 | 10/2012 | Shero et al. | |
| 10,378,105 B2 | 8/2019 | Yu et al. | |
| 2011/0180789 A1* | 7/2011 | Han | C23C 16/401 438/770 |
| 2020/0203154 A1* | 6/2020 | Seamons | C23C 16/401 |
| 2021/0118684 A1* | 4/2021 | Todd | H01L 21/02312 |
| 2021/0228684 A1* | 7/2021 | Delisle | A61K 47/02 |
| 2021/0351031 A1 | 11/2021 | Farm et al. | |
| 2022/0208555 A1 | 6/2022 | Lee et al. | |

OTHER PUBLICATIONS

Feng et al., Construction of the homogeneously mixed SAM composed of octyltriethoxysilane and octadecyltrichlorosilane by taking advantage of the molecular steric restriction, Colloids & Surfaces A: Physiochem. Eng. Aspects, 2008, 316, 194-201.
Zhang et al., "Patterning thin polymer films by surface-directed dewetting and pattern transfer," Polymer, 2003, pp. 3737-3743, vol. 44.
Zhang et al., "Rapid and Selective Deposition of Patterned Thin Films on Heterogeneous Substrates via Spin Coating," ACS Applied Materials & Interfaces, 2019, pp. 21177-21183, vol. 11.
EPO, Extended European Search Report for EP Application No. 23206546.6, Apr. 20, 2024.

* cited by examiner

*Primary Examiner* — Ian A Rummel
(74) *Attorney, Agent, or Firm* — Hodgson Russ LLP (57) ABSTRACT

An inert coating is applied to less than an entirety of a surface of a substrate to form exposed regions on the substrate between the inert coating. Precursors are introduced around the substrate thereby forming a polymer coating directly on the exposed regions of the substrate. The polymer coating can be adsorbed on the exposed regions of the substrate.

15 Claims, 6 Drawing Sheets

TMSDMA

TMSDMA + DDMS

MULTILAYER HYDROPHOBIC FILM

FIELD OF THE DISCLOSURE

This disclosure relates to hydrophobic films and, more particularly, to hydrophobic films used in semiconductor devices.

BACKGROUND OF THE DISCLOSURE

Shrinking device dimensions in semiconductor manufacturing require new processing approaches. One such approach is selective deposition, which has gained increasing interest among semiconductor manufacturers. Selective deposition would be beneficial in various ways. For instance, selective deposition may enable a decrease in lithography and etch steps, thereby reducing manufacturing costs. Selective deposition also may enable enhanced scaling in narrow structures.

Atomic layer deposition (ALD) is a known process in the semiconductor industry for forming thin films of materials on substrates, such as silicon wafers. ALD is a type of vapor deposition wherein a film is built up through self-saturating surface reactions performed in cycles. In an ALD process, gaseous precursors are supplied, alternatingly and repeatedly, to the substrate to form a thin film of material on the substrate. One reactant adsorbs in a self-limiting process on the wafer. A subsequent reactant pulse reacts with the adsorbed material to form a molecular layer of the desired material. The subsequent pulse can reduce or getter ligands from the adsorbed layer, can replace such ligands, or can otherwise add atoms (e.g., oxidize, nitridize, etc.). In a typical ALD reaction, no more than a molecular monolayer forms per cycle. Cycles can be more complex and can involve three or more reactants in sequence. Some recognized advantages of ALD are low temperature processing and near perfect conformality, leading to interest in ALD for semiconductor processing.

Other processes exist besides ALD to form thin films of materials on substrates. One such process is chemical vapor deposition (CVD), in which a substrate is exposed to one or more volatile precursors that react and/or decompose on the substrate to form a thin film. Both ALD and CVD can be sensitive to the exposed surface. Depending upon the precursors and deposition conditions, vapor deposition processes can nucleate well or poorly on different surfaces.

Polymerization on a substrate surface can occur during some processing. Various techniques have been used to control polymerization on a surface of a substrate. For example, varying the temperature, vapor pressure, and reaction time have been used during organic thin film deposition processes to control polymerization. External species also have been introduced to control the polymer growth. For example, co-dosing a catalyst with the polymer precursors can help with the polymerization or depositing an adhesion layer on the substrate surface.

Figure 1:
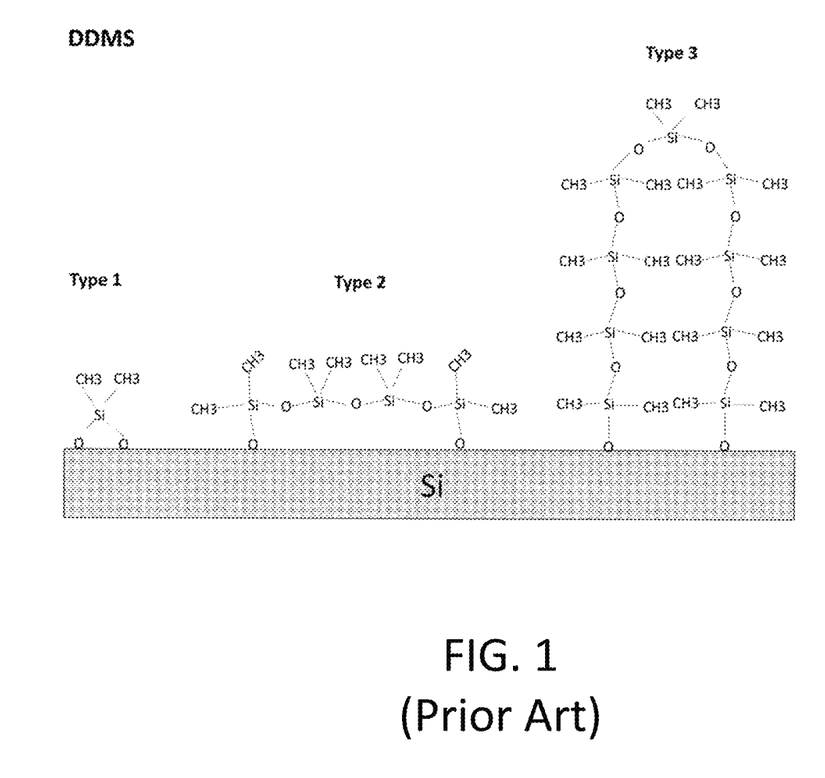
FIG. 1 is diagram of a previous thin film.

For some thin films, controlling polymerization using previous techniques is still not enough. In some cases, different thin film growth modes still result in similar system energies because one is not significantly energetically more preferred than others. As an example, FIG. 1 shows three possible thin film structures (Type 1, Type 2, and Type 3) that can co-exist in a film formed by depositing a dimethyldichlorosilane (DDMS) precursor. Only a single thin film structure may be desired.

Therefore, improved techniques and devices are needed.

BRIEF SUMMARY OF THE DISCLOSURE

A method is provided in a first embodiment. An inert coating is applied to less than an entirety of a surface of a substrate thereby forming exposed regions on the substrate between the inert coating. Precursors are introduced around the substrate thereby forming a polymer coating directly on the exposed regions of the substrate.

The polymer coating may only be formed on the exposed regions of the substrate.

The polymer coating may be formed on the exposed regions of the substrate and extend across the inert coating between exposed regions.

The polymer coating may be adsorbed on the exposed regions of the substrate.

The inert coating may be N,N-dimethyltrimethylsilylamine, N,N-diethyltrimethylsilylamine, chlorotrimethylsilane, methoxytrimethylsilane, ethoxytrimethylsilane, trimethylsilyl trifluoromethanesulfonate, trimethylsilyl fluorosulfonate, or trimethylsilyl chloride.

The precursors may include dimethyldichlorosilane (DDMS), dimethyldimethoxysilane, diethoxydimethylsilane, or c, 1,3-Dichloro-1,1,3,3-tetramethyldisiloxane.

The applying can be molecular vapor deposition, vapor deposition, or liquid deposition.

The exposed regions can be greater than 10% of the surface. The polymer coating can include horizontal growth of polymers in the polymer coating.

The substrate may be silicon or aluminum oxide.

A device is provided in a second embodiment. The device includes a substrate; an inert coating disposed on less than an entirety of the substrate; and a polymer coating formed directly on the exposed regions of the substrate. Exposed regions of the substrate are formed between the inert coating.

The substrate may be silicon or aluminum oxide.

The inert coating may be N,N-dimethyltrimethylsilylamine, N,N-diethyltrimethylsilylamine, chlorotrimethylsilane, methoxytrimethylsilane, ethoxytrimethylsilane, trimethylsilyl trifluoromethanesulfonate, trimethylsilyl fluorosulfonate, or trimethylsilyl chloride.

The precursors may include dimethyldichlorosilane (DDMS), dimethyldimethoxysilane, diethoxydimethylsilane, or c, 1,3-Dichloro-1,1,3,3-tetramethyldisiloxane.

The polymer coating may only be formed on the exposed regions of the substrate.

The polymer coating may be formed on the exposed regions of the substrate and extend across the inert coating between exposed regions.

The polymer coating may be adsorbed on the exposed regions of the substrate.

The exposed regions can be greater than 10% of the surface.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can control the polymerization of thin film precursor molecules. Controlling polymerization can result in different surface atomic structures that may provide improved thin film properties for certain applications. A first layer is deposited on a substrate in the embodiments disclosed herein. A second layer is then deposited. The second layer forms a polymer that will selectively nucleate. For example, the second layer can form a polymer on the substrate surface areas not covered by the first layer. The polymerization of the second layer is influenced by the structure of the first layer.

Figure 2:
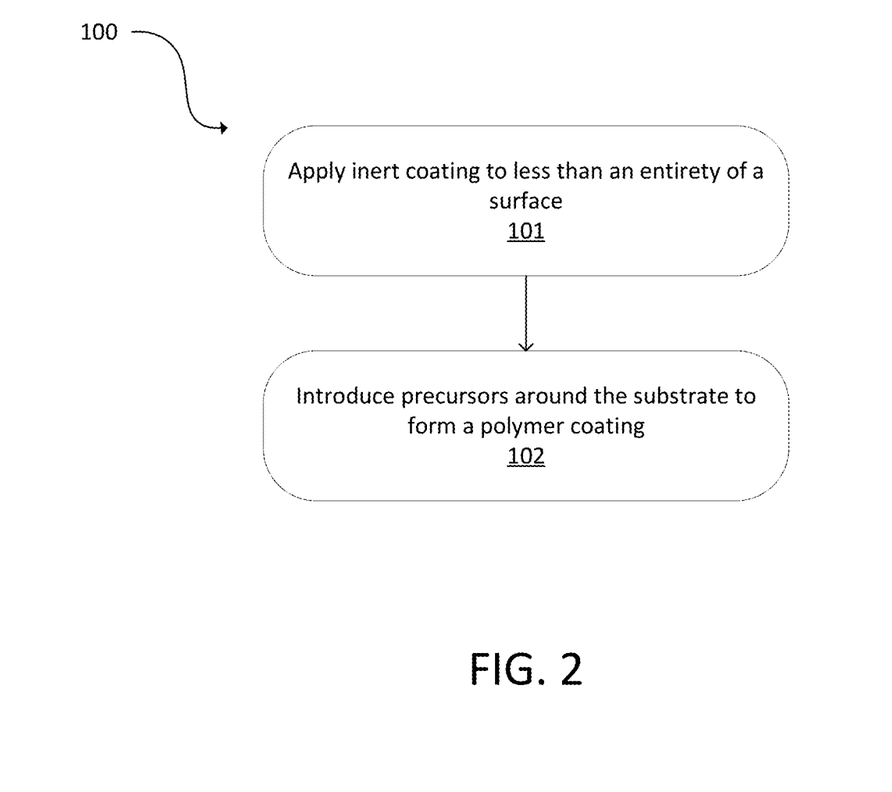
FIG. 2 is a flowchart of an embodiment of a method in accordance with the present disclosure.

FIG. 2 is a flowchart of an embodiment of a method 100. At 101, an inert coating is applied to less than an entirety of a surface of a substrate. The inert coating forms exposed regions on the substrate between the inert coating. For example, there may be apertures or other patterns in the inert coating that leaves an exposed surface of the substrate. The substrate can be, for example, silicon or aluminum oxide ($Al_2O_3$).

The inert coating can be applied using molecular vapor deposition (MVD), other vapor deposition (e.g., chemical vapor deposition (CVD), physical vapor deposition (PVD), or evaporation-based techniques), or liquid deposition. The liquid deposition can include dissolving the precursor (e.g., N,N-dimethyltrimethylsilylamine (TMSDMA)) in organic solvents such as acetone. The substrate can be coated by the TMSDMA by soaking the substrate in the solution for period of time.

The pattern of the inert coating can be controlled by the surface of the substrate and precursor structures. Reaction conditions can be configured to only partially react with the surface or block part of the surface. Thus, reaction time, dosing, or other variables can be configured so the inert coating blocks some of the surface of the substrate and still enable subsequent polymer larger growth.

The substrate surface can be a bare Si surface. The selectivity, coverage, and uniformity can vary on other surfaces. For example, a component made of Si is deposited onto with this coating. The component then is assembled with other parts to become a module. If $Al_2O_3$ is subsequently deposited on the whole module, the Si component will have delayed deposition while the other areas will have normal deposition.

The inert coating can be, for example, TMSDMA, N,N-diethyltrimethylsilylamine (TMSDEA), chlorotrimethylsilane (TMCS), methoxytrimethylsilane (TMSOMe), ethoxytrimethylsilane (TMSOEt), trimethylsilyl trifluoromethanesulfonate (TMSOTf), trimethylsilyl fluorosulfonate (TMSOFs), trimethylsilyl chloride (TMSCl), mixtures thereof, or other species. The other species may be organosilanes with one or more hydrophobic tail groups. The inert coating can have a thickness from, for example, 2 Angstroms to 50 Angstroms.

The head group of the inert coating species can have different reactivities. In terms of reactivity from highest to lowest, the inert coating species can include, for example, amino silane, chlorosilane, methoxy silane, or ethoxy silane. Using this example, the surface coverage is higher with a short reaction time using amino silane than the inert coating grown by the ethoxy silane. Thus, the ethoxy silane can result in a larger aperture that enables more exposed silicon surface for the polymer layer.

At 102, precursors are introduced around the substrate. This forms a polymer coating directly on the exposed regions of the substrate. The polymer coating can be adsorbed on the exposed regions of the substrate. In thermodynamics, the inert coating has low surface energy and may be a stable surface. The nucleation of the polymer coating may not occur on the inert coating because the interface energy is otherwise too high. Growth will preferentially occur on the area that is not covered by the inert coating. Kinetically, the precursor of the polymer coating can have negligible reactivity on the inert coating.

The precursors can include dimethyldichlorosilane (DDMS), dimethyldimethoxysilane, diethoxydimethylsilane, c, 1,3-Dichloro-1,1,3,3-tetramethyldisiloxane, or mixtures thereof. Other precursors can be organosilane monomers that have two reactive functional groups that enable polymerization to form a polymer chain. Other precursors are possible and these are merely examples.

In an instance, the polymer coating is only formed on the exposed regions of the substrate (i.e., not on the inert coating). In another instance, the polymer coating is formed on the exposed regions of the substrate and extends across the inert coating between exposed regions of the substrate. Thus, the growth of the polymers in the polymer coating can include vertical growth away from the exposed region of the substrate surface or horizontal growth over the inert coating.

The exposed regions can be greater than 10% of the surface of the substrate. The portion of the exposed surface can vary. For example, the exposed regions can be greater than 15%, 20%, 25%, 30%, 35%, 40%, 45%, 50%, 55%, 60%, 65%, 70%, 75%, 80%, 85%, 90%, 98%, or 99% of the substrate. The property of the subsequent polymer growth can be modified by changing the portion of the exposed surface. Local coverage of the inert coating can be controlled by changing process parameters such as reaction time, plasma pre-treatment conditions, water catalyst amount, or other parameters.

The deposition temperature for the inert coating and polymer layer can be from room temperature to 150° C. For example, the deposition temperature can be from 20° C. to 150° C. or at approximately 35° C.

A base pressure before precursor injection can be 0.01 Torr. In an example, the precursor dosage is from 0.5 to 2 Torr and the water dosage is from 0.5 to 4 Torr.

Surface coverage of the polymer coating on the substrate can be from less than 1% to less than 90%, such as being greater than 10% or from approximately 1% to 50%.

The size of exposed regions can be from 0.2 nm to 1 nm in width or length. The size of the exposed regions can be tuned to adjust the polymer growth modes. This may be based on the steric hindrance. If the size of an exposed area is 10 nm, which is large compared to the monomer molecular size, the polymer can grow in horizontal direction.

However, the chain length is limited by the 10 nm exposed area, assuming the linear growth. If the size of an exposed area is 1 nm, then it is unlikely for the polymer to grow in horizontal mode. It forces the polymerization in vertical mode.

In principle, the polymer precursor can react with itself only to form cyclic or linear polymers. By controlling the size of exposed areas of the substrate, the horizontal growth can be tuned and can force the second layer to polymerize vertically or form single molecules. Thus, there can be three different growth modes: horizontal, vertical, and single molecule mode. The single molecule mode may not be avoided by controlling the size of exposed areas.

In an example, there may not be a pattern of the inert coating because the substrate structure is amorphous. The material of the substrate can affect the inert coating. The pattern of the inert coating can be a periodicity of surface features. Consequently, an amorphous structure will not have a regular pattern.

Figure 3:
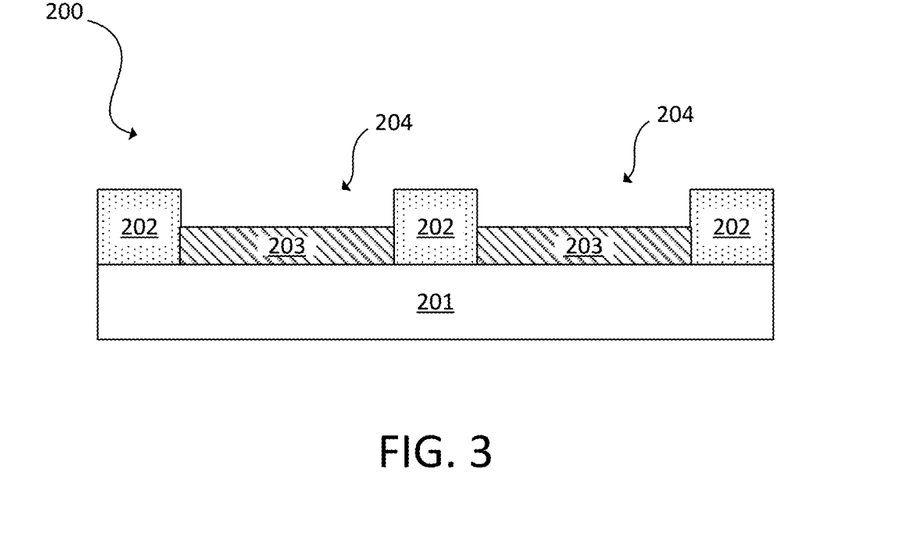
FIG. 3 is a cross-sectional diagram of an embodiment of a device in accordance with the present disclosure.
Figure 4:
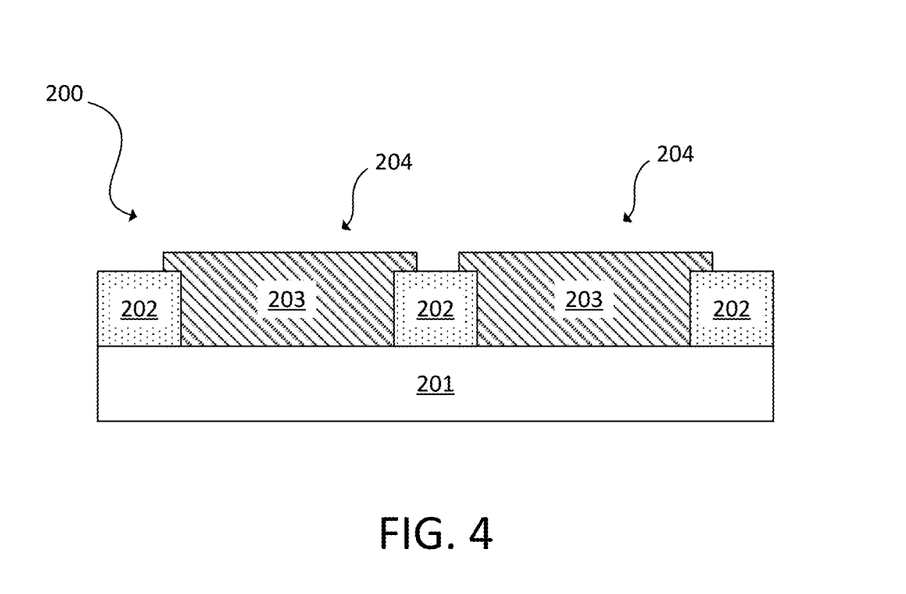
FIG. 4 is a cross-sectional diagram of another embodiment of a device in accordance with the present disclosure.

FIGS. 3 and 4 are cross-sectional diagrams a device 200. The device includes a substrate 201 and an inert coating 202 on less than an entirety of the surface of the substrate 201. Exposed regions 204 between the inert coating 202 have been filled with a polymer coating 203. The polymers in the polymer coating 203 can be adsorbed on the substrate 201. The polymer coating 203 is preferentially formed directly on the exposed regions 204 of the substrate 201. The exposed regions 204 can be greater than 10% of the surface of the substrate 201.

Some minimal amount of the polymer coating 203 can be formed on the inert coating 202. For example, the polymer precursor can be physiosorbed on the inert coating 202. Then the polymer can grow from the physiosorbed molecule. Any growth of the polymer coating 203 on the inert coating 202 will not be formed via covalent surface bonding. The area that the polymer coating 203 forms on the inert coating 202 may be less than 10%, less than 5%, less than 2%, or less than 1% of the surface area of the inert coating.

In an instance, the polymer coating 203 is only formed on the exposed regions 204 of the substrate 201 between the inert coating 202. This is shown in FIG. 3, which includes vertical growth. However, the polymer coating 203 also can be formed across the inert coating 202 between the exposed regions 204 as shown in FIG. 4. The polymer coating 203 in FIG. 4 includes both vertical and horizontal growth. While shown as not completely extending across the inert coating 202 in FIG. 4, the polymer coating 203 can extend to connect between the various exposed regions 204.

The thickness of the polymer coating 203 can be less than or equal to 20 nm. For example, the coating may be from 1 nm to 5 nm.

Figure 5:
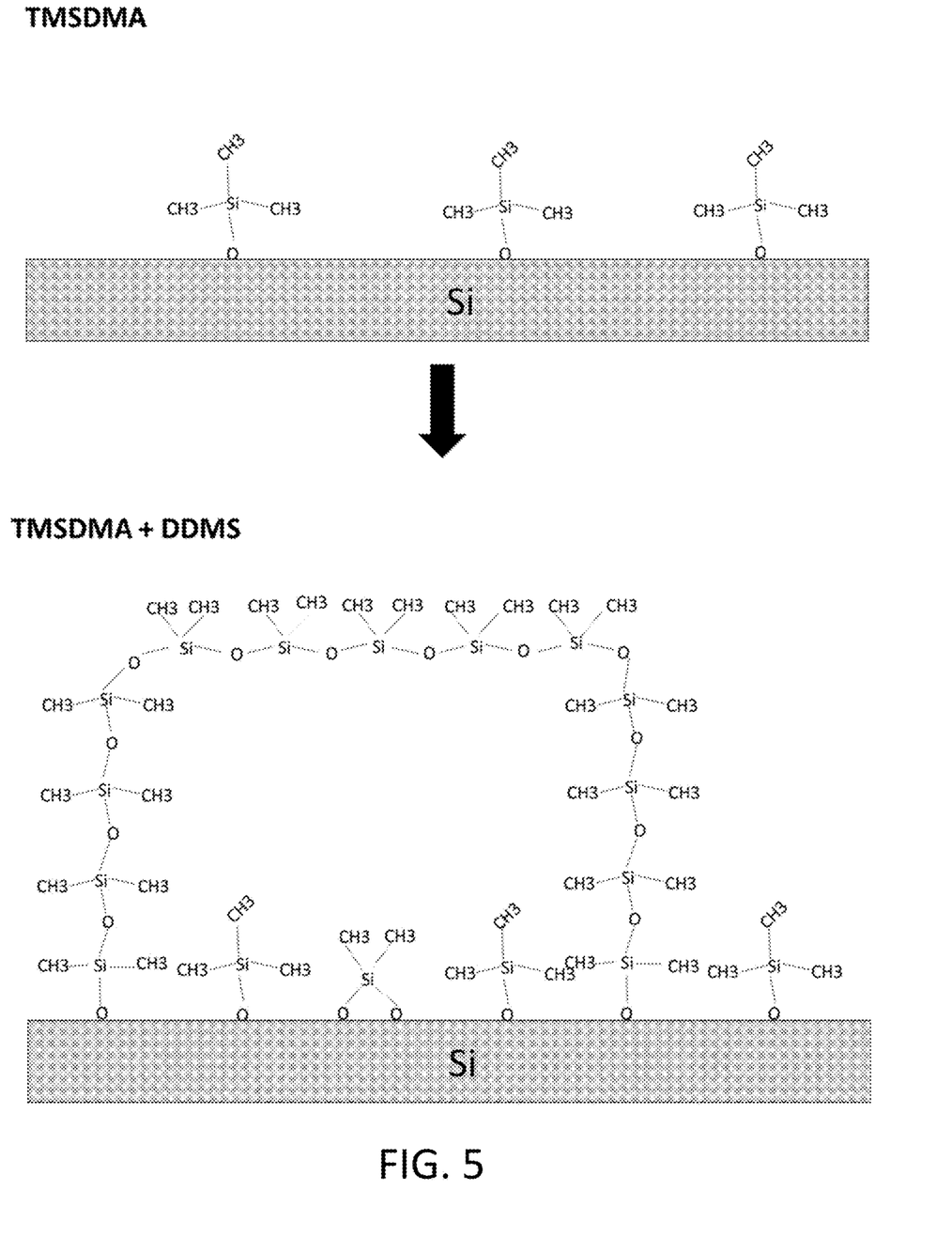
FIG. 5 is a diagram of another example of a thin film in accordance with the present disclosure.

FIG. 5 is a diagram of another example of a device. In this example, the vapor deposition is performed in an MVD chamber. The inert layer is formed by TMSDMA. The TMSDMA molecules are injected to the MVD chamber where they are deposited on one or more substrates. The reaction time is typically approximately 15 minutes per cycle. An inert gas, such as $N_2$ or Ar, is used to purge out unreacted precursor gases and reaction byproducts.

In this example, after the inert layer is formed by the first molecule, the polymer precursor molecules DDMS and $H_2O$ are injected into the MVD chamber. Both DDMS and $H_2O$ are kept in the chamber until a reaction cycle is finished. Each reaction cycle may take approximately 15 minutes. After a reaction cycle is completed, inert gas, such as $N_2$ or Ar, is used to purge out the unreacted gases and reaction byproducts. Multiple reaction cycles may be needed to create a thin film.

Using the technique in the method 100 in this example results in a DDMS film with minimized horizontal polymerization on top of the substrate. The TMSDMA film has an improved property in delaying nucleation of other thin films grown on top of the TMSDMA film. Based on testing, using DDMS as disclosed herein can delay the $Al_2O_3$ growth by approximately 1.5× the number of cycles compared to previous methods of using DDMS single layers only. Using TMSDMA as disclosed herein can delay the $Al_2O_3$ growth by approximately 2× the number of cycles compared to previous methods of using TMSDMA single layers only. This improved nucleation delaying property has application in area selective deposition.

For example, the embodiments disclosed herein can be used in area selective deposition. As mentioned above, the DDMS film deposited after the TMSDMA layer using can result in an improved nucleation delaying property. This TMSDMA and DDMS combination film can be applied on some devices/areas of a device system whereas the other devices/areas are not covered by the film. The deposition of other materials, such as $Al_2O_3$, will only happen on the devices/areas that are not covered by the TMSDMA and DDMS combination film. Consequently, this can result in an area selective deposition.

A growth rate of $Al_2O_3$ can be reduced in regions with the TMSDMA film (modified by DDMS). With a removal step, no net deposition can be achieved. Area-selective deposition can result in the protected areas having discontinuous ($Al_2O_3$) films, but the unprotected areas can have continuous films. It can be easier to remove the discontinuous film.

Besides $Al_2O_3$, other oxides such as ZnO, $TiO_2$, $HfO_2$, $SiO_2$ can be selectively deposited. Other species such as nitrides (e.g., TiN or HfN), metals (e.g., Ru, Pd, or Pt), or organic materials (e.g., poly(alkoxysilane)s) also can be selectively deposited.

Selective deposition is desirable in many applications. For example, the patterning in the fabrication of integrated circuits often require expensive lithography and/or masking processes. If a thin film can only selectively deposit on some areas that are not protected by the organic layers formed by this approach, some mask and/or lithography processes can be eliminated. This reduces semiconductor manufacturing costs.

Both the inert coating and polymer coating can be hydrophobic. The multilayer formation can include the inert coating and polymer coating.

The following examples are presented for illustrative purposes and is not intended to be limiting.

Figure 6:
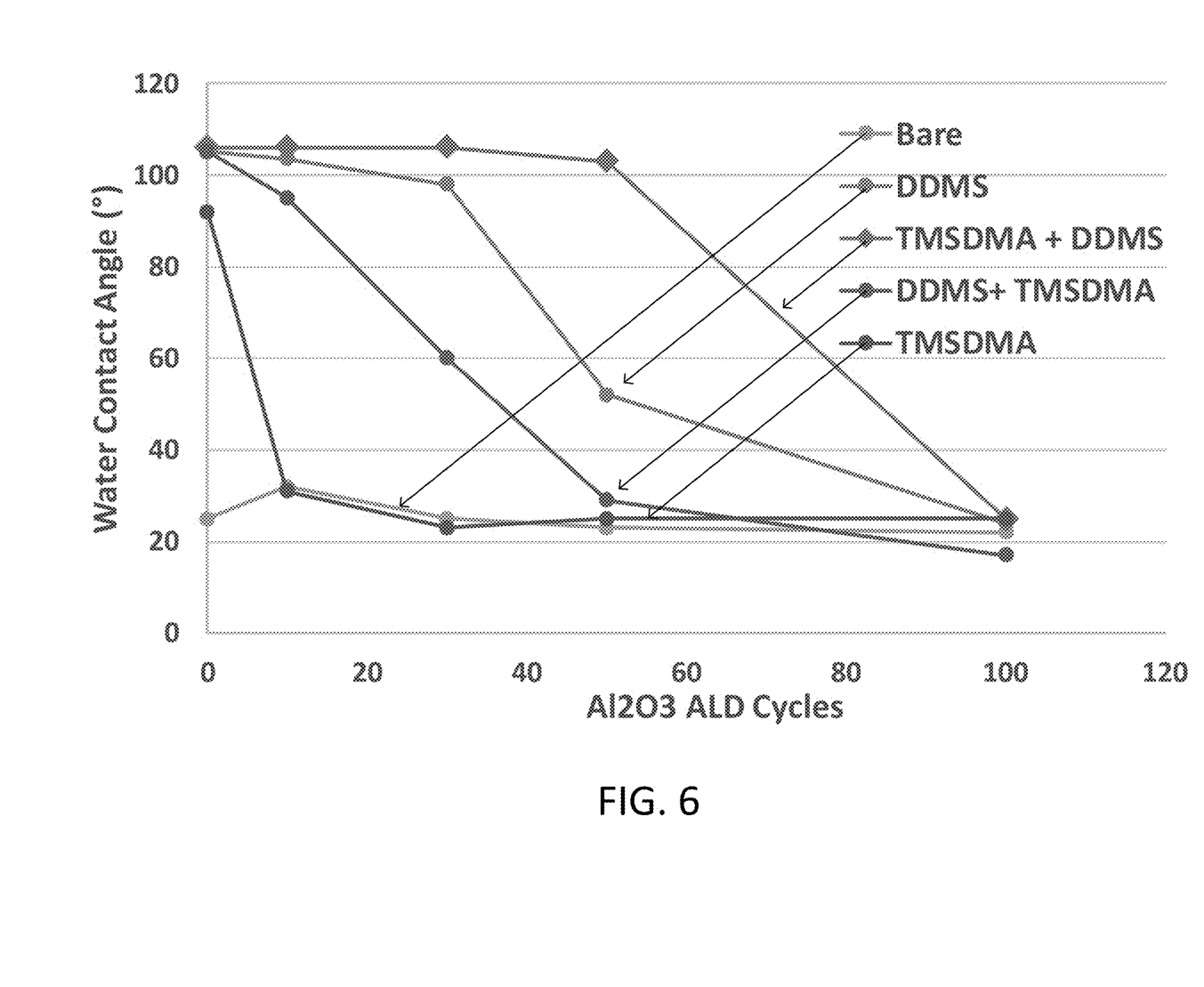
FIG. 6 shows water contact angle (WCA) by cycle.
Figure 7:
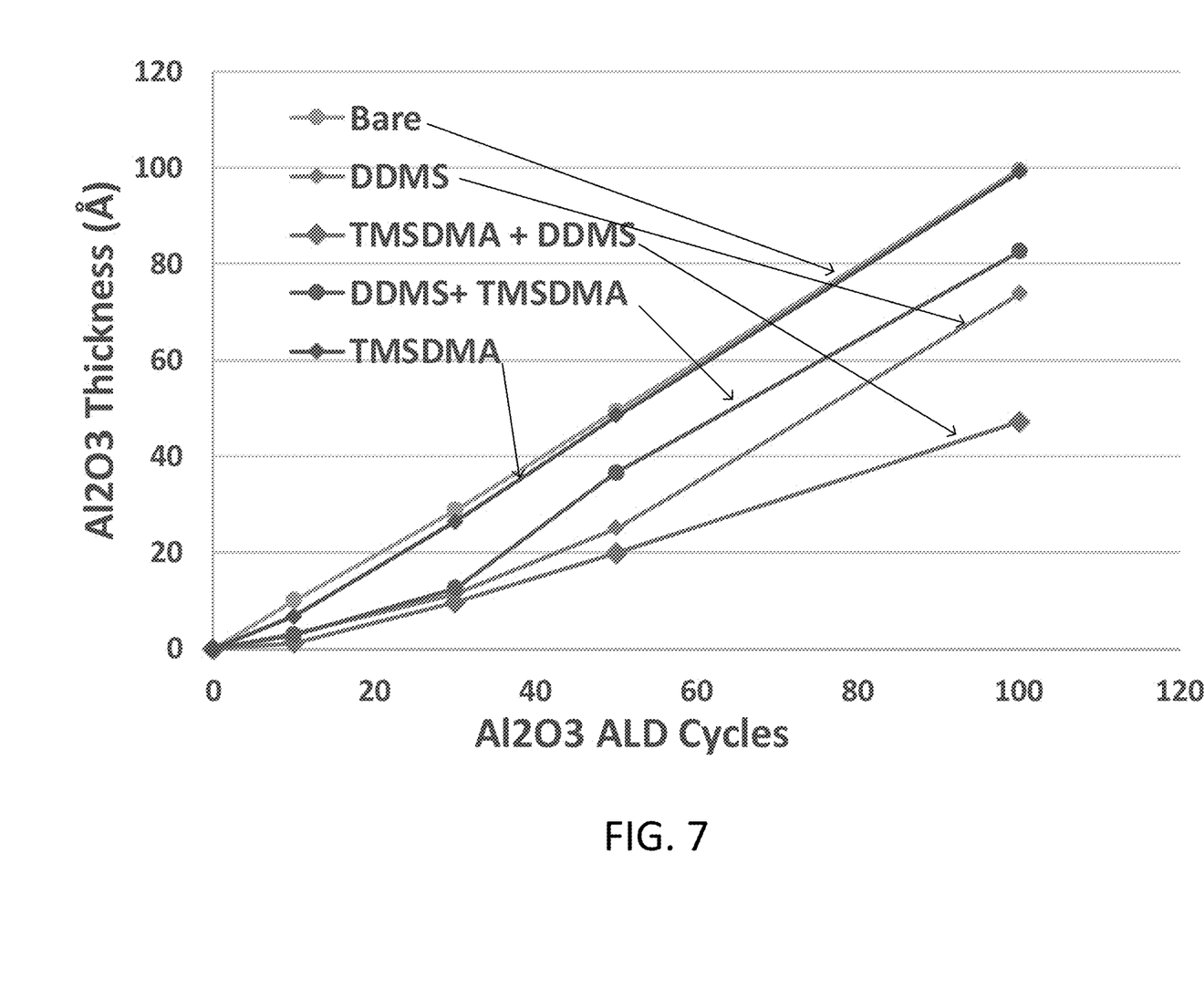
FIG. 7 shows Al thickness by cycle.

FIG. 6 shows WCA by cycle. FIG. 7 shows Al thickness by cycle. For these results, MVD was performed on a bare silicon substrate (12-Angstrom native oxide) or $Al_2O_3$ on a substrate. The first layer was TMSDMA with an $N_2$ purge. The cycle was approximately 15 minutes and there were four cycles. The second layer was DDMS and $H_2O$ with an $N_2$ purge. The cycle was approximately 15 minutes and there were four cycles. Thus, the two steps were alternately repeated four times each.

For ALD $Al_2O_3$ there was no plasma pre-treatment. TMA was deposited with an Ar purge followed by $H_2O$ and an Ar purge. The process occurred at 60° C. and one cycle was performed.

Additional test data for $Al_2O_3$ deposition is shown in the table below.

| 30 Cycles of Al$_2$O$_3$ Deposition | | |
|---|---|---|
| | Water Contact Angle Change (°) | Al$_2$O$_3$ Thickness (Å) |
| TMCS | −46 | 27 |
| DDMS | −75 | 20 |
| TMCS + DDMS | −11 | 13 |
| DDMS + TMCS | −10 | 12 |
| Si | −17 | 36 |

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of deposition comprising:
 applying an inert coating to less than an entirety of a surface of a substrate thereby forming exposed regions on the substrate between the inert coating, wherein the inert coating is N,N-dimethyltrimethylsilylamine, N,N-diethyltrimethylsilylamine, chlorotrimethylsilane, methoxytrimethylsilane, ethoxytrimethylsilane, trimethylsilyl trifluoromethanesulfonate, trimethylsilyl fluorosulfonate, or trimethylsilyl chloride; and
 introducing precursors around the substrate thereby forming a polymer coating directly on the exposed regions of the substrate and sidewalls of the inert coating, wherein the precursors include dimethyldichlorosilane (DDMS), dimethyldimethoxysilane, diethoxydimethylsilane, or c, 1,3-Dichloro-1,1,3,3-tetramethyldisiloxane.

2. The method of deposition of claim 1, wherein the polymer coating is only formed on the exposed regions of the substrate and the sidewalls.

3. The method of deposition of claim 1, wherein the polymer coating is formed on the exposed regions of the substrate and extends across the inert coating between exposed regions.

4. The method of deposition of claim 1, wherein the polymer coating is adsorbed on the exposed regions of the substrate.

5. The method of claim 1, wherein the applying is molecular vapor deposition.

6. The method of claim 1, wherein the applying is vapor deposition.

7. The method of claim 1, wherein the applying is liquid deposition.

8. The method of deposition of claim 1, wherein the exposed regions are greater than 10% of the surface, and wherein the polymer coating includes horizontal growth of polymers in the polymer coating.

9. The method of deposition of claim 1, wherein the substrate is silicon or aluminum oxide.

10. A device comprising:
 a substrate;
 an inert coating disposed on less than an entirety of the substrate, wherein exposed regions of the substrate are formed between the inert coating, wherein the inert coating is N,N-dimethyltrimethylsilylamine, N,N-diethyltrimethylsilylamine, chlorotrimethylsilane, methoxytrimethylsilane, ethoxytrimethylsilane, trimethylsilyl trifluoromethanesulfonate, trimethylsilyl fluorosulfonate, or trimethylsilyl chloride; and
 a polymer coating formed directly on the exposed regions of the substrate and sidewalls of the inert coating, wherein the polymer coating is formed from precursors that include dimethyldichlorosilane (DDMS), dimethyldimethoxysilane, diethoxydimethylsilane, or c, 1,3-Dichloro-1,1,3,3-tetramethyldisiloxane.

11. The device of claim 10, wherein the substrate is silicon or aluminum oxide.

12. The device of claim 10, wherein the polymer coating is only formed on the exposed regions of the substrate and the sidewalls.

13. The device of claim 10, wherein the polymer coating is formed on the exposed regions of the substrate and extends across the inert coating between exposed regions.

14. The device of claim 10, wherein the polymer coating is adsorbed on the exposed regions of the substrate.

15. The device of claim 10, wherein the exposed regions are greater than 10% of the surface.

* * * * *